(12) United States Patent
Dyer et al.

(10) Patent No.: US 7,485,516 B2
(45) Date of Patent: Feb. 3, 2009

(54) METHOD OF ION IMPLANTATION OF NITROGEN INTO SEMICONDUCTOR SUBSTRATE PRIOR TO OXIDATION FOR OFFSET SPACER FORMATION

(75) Inventors: Thomas W. Dyer, Pleasant Valley, NY (US); Jinhong Li, Poughquag, NY (US); Zhijiong Luo, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 234 days.

(21) Appl. No.: 11/164,376

(22) Filed: Nov. 21, 2005

(65) Prior Publication Data

US 2007/0114605 A1    May 24, 2007

(51) Int. Cl.
*H01L 21/336*    (2006.01)
(52) U.S. Cl. .................. 438/197; 438/775; 438/776; 438/777; 438/627; 438/643; 438/653; 257/751; 257/E23.16; 257/E21.584
(58) Field of Classification Search .......... 257/751, 257/E23.16, E28.584, E21.584; 438/627, 438/643, 653, 775–777, 791–794, 197
See application file for complete search history.

(56) References Cited

U.S. PATENT DOCUMENTS

| | | | |
|---|---|---|---|
| 5,786,254 A * | 7/1998 | Hao et al. | 438/287 |
| 5,882,974 A * | 3/1999 | Gardner et al. | 438/286 |
| 6,037,639 A | 3/2000 | Ahmad | |
| 6,229,198 B1 | 5/2001 | Ibok et al. | |
| 6,297,106 B1 | 10/2001 | Pan et al. | |
| 6,720,213 B1 | 4/2004 | Gambino et al. | |
| 6,838,777 B2 | 1/2005 | Igarashi | |
| 2005/0145942 A1 | 7/2005 | Gehres | |

* cited by examiner

*Primary Examiner*—Zandra Smith
*Assistant Examiner*—Sonya D McCall Shepard
(74) *Attorney, Agent, or Firm*—Graham S. Jones, II; H. Daniel Schnurmann

(57) ABSTRACT

A method of formation of integrated circuit devices includes forming a gate electrode stack over a portion of a semiconductor. The stack includes a gate dielectric layer with a gate electrode thereabove. Implant diatomic nitrogen and/or nitrogen atoms into the substrate aside from the stack at a maximum energy less than or equal to 10 keV for diatomic nitrogen and at a maximum energy less than or equal to 5 keV for atomic nitrogen at a temperature less than or equal to 1000° C. for a time of less than or equal to 30 minutes. Then form silicon oxide offset spacers on sidewalls of the stack. Form source/drain extension regions in the substrate aside from the offset spacers. Form nitride sidewall spacers on outer surfaces of the offset spacers over another portion of the nitrogen implanted layer. Then form source/drain regions in the substrate aside from the sidewall spacers.

16 Claims, 12 Drawing Sheets

US 7,485,516 B2

METHOD OF ION IMPLANTATION OF NITROGEN INTO SEMICONDUCTOR SUBSTRATE PRIOR TO OXIDATION FOR OFFSET SPACER FORMATION

BACKGROUND OF THE INVENTION

This invention relates to CMOS FET devices; and more particularly to methods of manufacture of FET devices, in which offset spacers are formed prior to the steps of formation of source/drain extensions followed by formation of sidewall spacers and devices manufactured thereby.

In the process of manufacture of CMOS (Complementary Metal Oxide Semiconductor) FET (Field Effect Transistor) devices (hereinafter referred to as MOSFET devices), during an intermediate point in the process gate electrode stacks of gate dielectric below and polysilicon above are formed on the top surface of a doped semiconductor substrate. Below each of the MOSFET devices, a channel will be located directly below the gate electrode in the semiconductor substrate. Subsequently, offset spacers composed of a dielectric material, e.g. silicon oxide, are formed on the vertical sidewalls of the gate electrode stacks to protect the channel below the gate electrode stack from introduction of counterdopant therein during the subsequent step of formation of source/drain extensions. Next, the source/drain extensions are formed by counterdoping regions in the surface of the semiconductor substrate with a light implantation of dopant aside from the gate electrode stacks. Then sidewall spacers composed of a material, e.g. silicon nitride, are formed on the sidewalls of the offset spacers to provide further spacing away from the channel of the source/drain regions which will be formed thereafter.

Forming an offset spacer is conventionally done by depositing and/or growing a uniform layer of silicon oxide on the sidewalls of a gate electrode stack followed by performing an anisotropic etch to leave silicon oxide offset spacers only on the gate electrode sidewalls (i.e. remove silicon oxide from the exposed horizontal surfaces including the top surfaces of the semiconductor substrate). This approach suffers from too much process variation due to the problem of excessive recessing of the crystalline silicon surface from the RIE over-etching of MOSFET devices as shown by FIGS. 3A and 3B.

FIGS. 3A and 3B are TEM images of a prior art MOSFET structure 8 in an early stage in a prior art process of manufacture thereof.

FIG. 3A is a low magnification TEM image with a 20.00 nm scale. The MOSFET structure 8 includes a silicon substrate 11 on which a gate electrode stack 23 is formed. The gate electrode stack 23 comprises a polysilicon gate electrode 20 formed over a gate dielectric layer 12 composed of silicon oxide formed over the surface of the silicon substrate 11 above a region to be formed as the channel region CH of a MOSFET device in the substrate 11. The gate electrode polysilicon 20 has a length of 46.1 nm. The sidewalls of the gate electrode 20 are covered with a pair of offset spacers 24 (35 Å thick) which were formed by deposition of a layer of silicon dioxide onto the surface of the device 8. Then the silicon dioxide was shaped by RIE processing into those offset spacers 24 shown on those sidewalls of the gate electrode 20. There is a RIE residual film 42 on the surface of the silicon substrate 11. A recess 40 in the top surface of the silicon substrate 11 is shown on either side of the channel CH. There is a problem that unwanted recesses 40 have been formed in the surface of the silicon substrate 11 indicated by the indicia 40 on either side of the gate electrode stack 23 and the channel CH. The unwanted recesses 40 (which have a depth 43 of about 49 Å) were formed due to the RIE processing used to shape the offset spacer 24 by etching it back. Unfortunately, the surface of the silicon semiconductor substrate 11 was etched excessively, as well. The depth 43 of 49 Å of the recesses 40 in the silicon substrate 11 has been found to be excessive which has caused a problem with overlap capacitance (Cov) and degradation of device performance in the devices of the scale currently being manufactured.

FIG. 3B shows the MOSFET structure 8 of FIG. 3A (a high magnification TEM image marked with a 7.00 nm scale.) The silicon substrate 11 supports the gate electrode stack 23 including the polysilicon gate electrode 20 formed over the gate dielectric layer 12 with the offset spacer 24 (35 Å thick) and RIE residual film 42 on the surface of the silicon substrate 11. The recess 40 in the surface of the silicon substrate 11 due to the RIE process used to shape the offset spacers 24 is also seen. At the bottom, the offset spacer thickness is indicated to be 29 Å and the thickness is 35 Å at a point located thereabove. The silicon recess 40 is indicated to have a depth of about 49 Å. The residual film 42 is shown to have a thickness of about 26 Å. The thickness of the gate oxide layer is indicated to be about 36 Å.

The device overlap capacitance Cov is very sensitive and varies as a function of the depth of the recess 40 in the surface of the silicon substrate 11 at the edges of the gate electrode stack 23. The degree of variation in the Cov has been a key technology challenge for the past several generations of shrinkage in the scale of MOSFET devices and is becoming more serious as device features scale to smaller and smaller dimensions. Moreover, this level of recess may cause undesired degradation of device performance.

U.S. Pat. No. 6,037,639 of Ahmad entitled "Fabrication of Integrated Devices Using Nitrogen Implantation" describes a process wherein nitrogen is implanted into the substrate of CMOS devices, which is employed to form a silicon nitride plug at the edge of the gate oxide of a MOSFET device to reduce the electric field in this region in order to suppress hot electron degradation. A step of nitrogen implantation comprising amorphization is performed in which regions of nitrogen ion implanted areas are formed in the substrate, altering the ordered substrate crystal structure and distorting the crystal lattice to accommodate these extra atoms in the implantation area. The amount of the nitrogen doping may range from about $1\times10^{12}$ atoms to $1\times10^{15}$ atoms at a very high implantation energy is in the range of about 10 keV to 100 keV. Following the step of nitrogen implantation, a thermal spacer growth step is carried out to form a surface silicon oxide layer over the future locations of source/drain regions and on the sidewalls of transistor gates. While this step forms a vertical sidewall insulating spacer on the sides of the polysilicon gate, it also repairs the implantation damage in the nitrogen implanted areas and produces a slight bird's beak structure under both the lower edges of each transistor polysilicon gate. Due to its shape, this structure is called a Gate Bird's Beak (GBB,) which increases the thickness of the gate oxide at the lower edges of the gate polysilicon in order to relieve the electric field intensity at the edges or corners of the gate structure. The spacer growth comprises a thermal oxidation forming a spacer composed of oxide. Preferred parameters for the oxidation comprise heating the structure to between about 700° C. and 1,100° C., more preferably between about 850° C. and 950° C. and most preferably about 907° C. The length of the oxidation may range from about 5 minutes to about an hour, more preferably between about 10 minutes and 20 minutes, and most preferably about 15 minutes. A dry oxygen atmosphere is preferred. Alternatively, the spacer growth may comprise a nitridation step. In Ahmad, the spacer growth step is a heating step, like a conventional post-doping thermal drive step. The oxidation of the substrate causes upward migration and consumption of silicon atoms from the nitrogen implanted areas (as well as from the gate polysilicon), to form an oxide layer on the surface of the semiconductor, above the nitrogen implanted areas as the result of upward motion of the implanted nitrogen atoms. The nitrogen concentration difference between the growing oxide layer and the nitrogen implanted areas provides the driving force for the reaction. The implanted nitrogen atoms migrate to the growing oxide layer at the substrate surface and a silicon nitride layer is formed between the growing oxide layer and the surface of the substrate. As well known in the art, silicon nitride has a high dielectric constant, higher in particular than silicon oxide, and is an effective barrier or protective layer against hot carrier injection at the gate edges, which is otherwise induced by the high electric field present in a ULSI device. Significantly, the silicon nitride layer also extends laterally at least partially under the gate polysilicon in the region of the GBB, due to mobility of atoms during the oxidation, and to form a nitride edge portion at least partially underlying the gate corner. The nitride edge portion may form only the oxide/substrate interface, as illustrated, or nitrogen atoms may diffuse through the growing oxide to the gate polysilicon. This laterally nitride grown edge portion effectively isolates the lower polysilicon gate edges from the neighboring source/drain regions and thus effectively minimizes the high electric field induced current leakages into the gate poly 112. As previously mentioned, in prior art applications the conventional oxide spacer deposition and the following heat treatment tend to limit the nitride formation to the region under the deposited sidewall spacer.

U.S. Pat. No. 6,229,198 of Ibok et al. entitled "Non-Uniform Gate Doping for Reduced Overlap Capacitance" describes a transistor comprising a gate electrode with a non-uniform impurity profile increasing from the drain side to the source side, thereby reducing the overlap capacitance between the gate electrode and drain region. In addition, the transverse electrical field in the channel region is maintained by evenly disposing gate impurity atoms throughout the entire gate electrode.

U.S. Pat. No. 6,297,106 of Pan et al. entitled "Transistors with Low Overlap Capacitance" describes the fabrication of integrated circuit devices and a method for reducing gate to drain and gate to source overlap capacitance of deep sub-micron CMOS devices to reduce device switching times by customizing the gate insulating layer, such that the dielectric constant, K, is lower in the gate to drain and gate to source overlap regions, relative to the more centrally located gate region between the source and drain.

U.S. Pat. No. 6,720,213 Gambino et al. for "Low-K Gate Spacers By Fluorine Implantation" describes a MOSFET device and a method of fabricating a MOSFET device having low-K dielectric oxide gate sidewall spacers produced by fluorine implantation, by implanting fluorine into the gate oxide sidewall spacers which is used to alter the properties of advanced composite gate dielectrics e.g. nitridized oxides, NO, and gate sidewall dielectrics, such that the low-K properties of fluorine are used to develop low parasitic capacitance MOSFETs.

U.S. Pat. No. 6,838,777 of Igarashi entitled "Semiconductor Device and Method of Manufacturing the Same" describes gate electrodes formed on a semiconductor substrate, each with a gate insulating film interposed therebetween. Offset spacers are formed on opposite faces of each of the gate insulating film and the gate electrodes. Diffusion layers are formed in the semiconductor substrate on opposite sides of a portion of the semiconductor substrate immediately under each of the gate electrodes by ion implantation. The gate electrodes have various configurations, e.g. a gate electrode having a rectangular section, an upwardly tapered gate electrode, and a downwardly tapered gate electrode. Making Field Effect Transistors Having Self-Aligned Source and Drain Regions Using U.S. patent application Ser. No. 2005/0145942 of Rainer E Gehres entitled "Method of Independently Controlled Spacer Widths" describes a method for defining spacings between the gates of FETs of an integrated circuit and the source/drain regions thereof. The spacings differ in width between a first FET and a second FET. The method includes forming gate stacks of the integrated circuit over a substrate, and forming first spacers on gate stack sidewalls. Then second spacers are formed over the first spacers. Next, source/drain regions of the first FET are formed in alignment with the second spacers of a first gate stack of the gate stacks. Next the second spacers are removed from the first spacers of the gate stacks. Then the first spacers of a second gate stack are etched anisotropically substantially vertically to remove horizontally extending portions of the first spacers, and source and drain regions of the second FET are formed in alignment with portions of the first spacers of the first gate stack remaining after the etching.

SUMMARY OF THE INVENTION

The present invention has the advantage that it differs from the process of the Ahmad patent cited above in that the nitrogen implantation into the silicon surface is performed to suppress oxidation of that surface when the polysilicon sidewall of the gate conductor is oxidized, whereas Ahmad intentionally forms an oxide layer over the silicon surface subsequent to the amorphization of the silicon by ion implantation of nitrogen therein.

Secondly, the present invention has the advantage that the nitrogen implantation is performed at a substantially lower energy, and invention intentionally avoids doping of the polysilicon sidewall of the gate electrode. In this way, the process of the present invention forms an offset spacer on the sidewalls gate of the gate electrode stack without requiring the step of anisotropic etching to remove oxide from the crystal silicon surface. Instead DHF etching may be employed to remove silicon oxide from said top surface of said doped region in said nitrogen implanted region completely without completely removing the silicon oxide from said vertically extending sidewalls of said gate electrode stack.

Thirdly, the nitrogen implantation does not form amorphous silicon, whereas unlike the present invention, the Ahmad patent describes forming amorphous silicon and distorting the bonds of the silicon in the nitrogen implanted silicon regions.

Fourthly no silicon nitride layer is formed on the surface of the nitrogen implanted regions, whereas, unlike the present invention, the Ahmad patent describes forming a silicon nitride layer between the nitrogen implanted regions in the semiconductor substrate and the silicon oxide layer thereabove. regions whereas Ahmad forms a silicon nitride layer between the nitrogen implanted regions and the silicon oxide layer thereabove.

Typical conditions for the nitrogen implant are performed at a lower energy of about 5 keV (between 2 keV and 10 keV) and a dose of around $2e14/cm^2$ (between $5e13/cm^2$ and $1e15/cm^2$). The species is typically diatomic nitrogen.

The oxidation is done in a furnace at around 800° C. (between 700° C. and 1000° C.) for about 10 minutes (between 5 and 30 minutes).

The present invention has the advantage that process conditions have been selected so that silicon nitride is not formed from the nitrogen in the semiconductor substrate.

A key feature of the present invention is the employment of a straight vertical implantation of nitrogen molecules or nitrogen atoms, so that the sidewalls of the polysilicon of the gate electrode are not implanted with nitrogen, but the surface of the semiconductor substrate is implanted with nitrogen using an implantation step for the purpose of retarding growth of silicon oxide on the surface of the semiconductor substrate. As stated above with the processing conditions employed in accordance with the method of this invention, silicon nitride is not formed in the semiconductor substrate.

Forming an offset spacer is conventionally done by depositing and/or growing an oxide and then using an anisotropic etch to leave oxide on the PC sidewall only (i.e. remove it from the horizontal surfaces). This approach suffers from too much process variation due to the recessing of the crystalline silicon surface from the RIE over-etch (see TEMs below). The device Cov (overlap capacitance) is very sensitive to this variation. This Cov variation has been a key technology challenge for the past several generations and is becoming more serious as dimensions scale, contributing to device degradation.

On the other hand, skipping the process of anisotropic etching has the disadvantage that the thick silicon oxide formed on the surface of the semiconductor substrate can block implantation of doping therethrough during the formation of the extension regions and formation of the halo regions in the semiconductor substrate causing undesired device degradation.

This invention has the additional advantage that the process employed eliminates the silicon recess issue by forming the offset spacer by vertically implanting nitrogen into the silicon surface prior to oxidation. The implanted nitrogen acts to suppress the oxide formation on the horizontal surfaces. The oxide then grows preferentially on the gate sidewall where it is needed to offset the extension implants and less on the horizontal silicon surface that receives the implants.

In accordance with this invention, a method is provided for forming an integrated circuit device including the following steps. Form a gate electrode stack over a portion of a semiconductor substrate with the gate electrode stack including a gate dielectric layer and a gate electrode overlying the gate dielectric layer. Implant nitrogen into the substrate aside from the gate electrode stack forming a nitrogen implanted layer in the substrate. Form offset spacers on the sidewalls of the gate electrode stack and over a portion of the nitrogen implanted layer. Preferably, implant a first level of dopant to form source/drain extension regions in the substrate aside from the offset spacers. Form sidewall spacers on outer surfaces of the offset spacers over another portion of the nitrogen implanted layer. Implant a higher level of dopant to form source/drain regions in the substrate aside from the sidewall spacers. Preferably, the offset spacers are composed of silicon oxide and the sidewall spacers are composed of silicon nitride. It is preferred that the offset spacer layer is formed in a furnace at between about 700° C. and about 1000° C. for a duration of between about 5 minutes and about 30 minutes. Preferably, the implanting of nitrogen is performed with nitrogen in the form of nitrogen atoms and/or diatomic nitrogen gas implanted into the substrate aside from the gate electrode stack. In the case of diatomic nitrogen, the energy should be between about 2 keV to about 10 keV with a dose between about $5e13/cm^2$ and about $1e15/cm^2$. For nitrogen atoms, the energy should be between about 1 keV and about 5 keV with a dose between about $1e14/cm^2$ and about $2e15/cm^2$.

Further in accordance with this invention, a method is provided for forming an integrated circuit device including the following steps. Form a gate electrode stack comprising a gate dielectric layer with a gate electrode overlying the gate dielectric layer over a portion of a semiconductor substrate. Implant nitrogen in the form of nitrogen atoms and/or diatomic nitrogen gas into the substrate aside from the gate electrode stack. For diatomic nitrogen the maximum energy should be less than or equal to 10 keV, between about 2 keV and about 10 keV and at dose of between about $5e13/cm^2$ and about $1e15/cm^2$. For nitrogen atoms, the maximum energy should be less than or equal to 5 keV, between about 1 keV and 5 keV and at a dose of between about 1e14/cms and about 2e15/cm2. Preferably, form offset spacers on sidewalls of the gate electrode stack; preferably by oxidation which is performed in a furnace between about 700° C. and about 1000° C. for a duration between about 5 minutes and about 30 minutes. Preferably, implant a first level of dopant to form source/drain extension regions in the substrate aside from the offset spacers. Preferably, form sidewall spacers on outer surfaces of the offset spacers over another portion of the nitrogen implanted layer, and implant a higher level of dopant to form source/drain regions in the substrate aside from the sidewall spacers. Preferably, the offset spacers are formed of silicon oxide. Preferably, the sidewall spacers are formed of silicon nitride.

In accordance with still another aspect of this invention, an integrated circuit is formed on a semiconductor substrate. A gate electrode stack comprising a gate dielectric layer and a gate electrode extend over a portion of the semiconductor substrate with the gate electrode stack having sidewalls. A layer in the semiconductor substrate aside from the gate electrode stack has been implanted with nitrogen aside from the gate electrode stack. Offset spacers have been formed on the sidewalls. Source/drain extension regions have been formed in the semiconductor substrate aside from the offset spacers. Sidewall spacers have been formed over the offset spacers along the sidewalls. Source/drain regions have been formed in the semiconductor substrate aside from the sidewall spacers. Preferably, the offset spacers are formed of silicon oxide. Preferably, the sidewall spacers are formed of silicon nitride. Preferably, the sidewall spacers are formed of silicon nitride.

The invention and objects and features thereof will be more readily apparent from the following detailed description and appended claims when taken with the drawings.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1A:
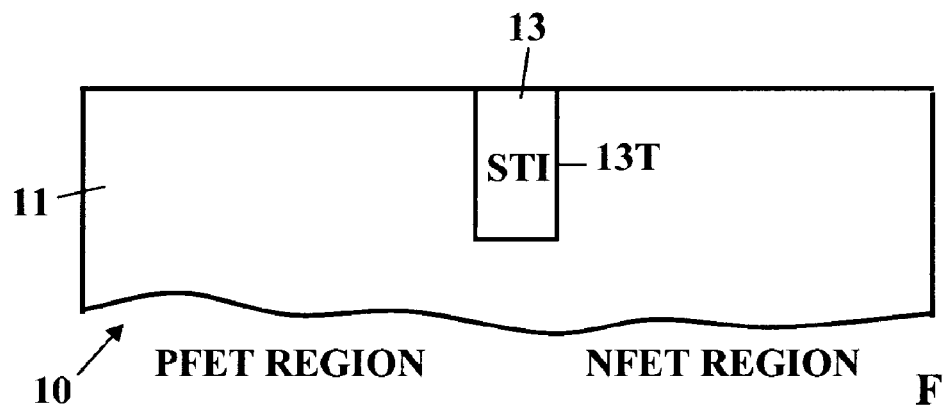
FIGS. 1A-1O show the process of forming a MOSFET device in accordance with the method of this invention.
Figure 1B:
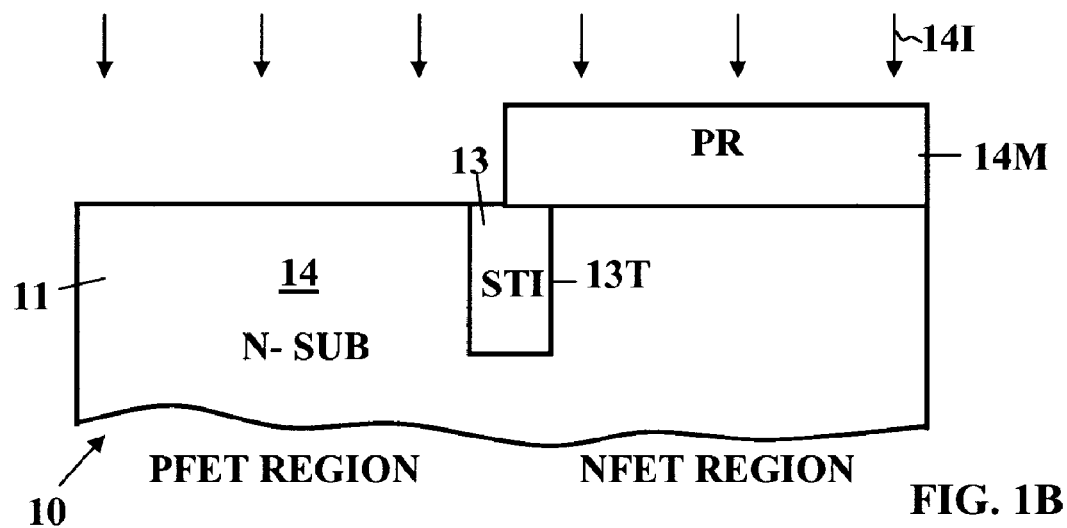
Figure 1C:
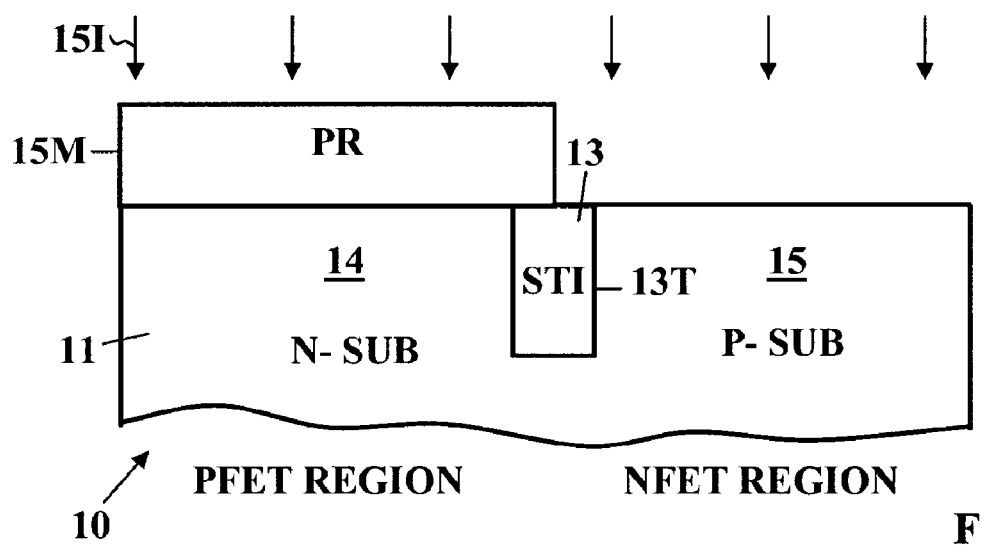
Figure 1D:
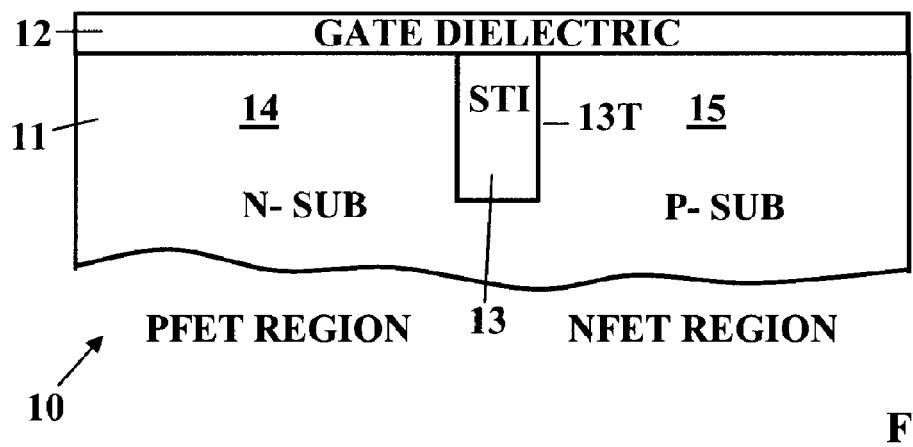
Figure 1E:
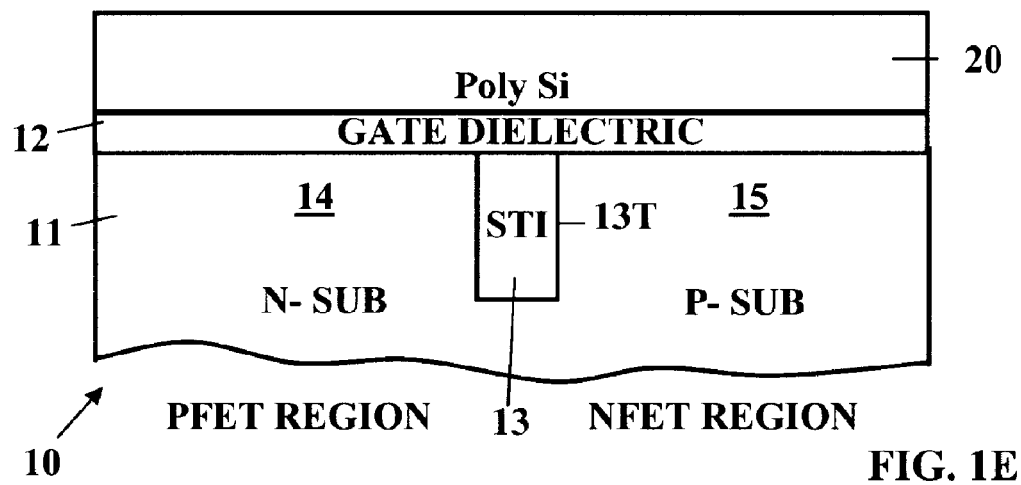
Figure 1F:
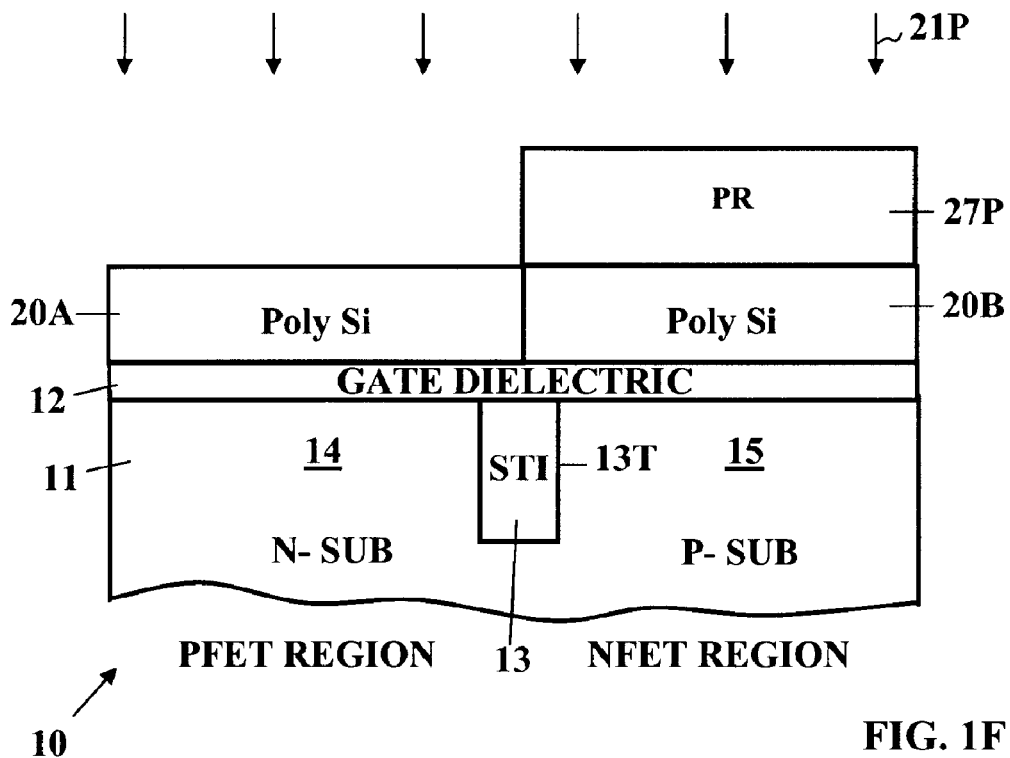
Figure 1G:
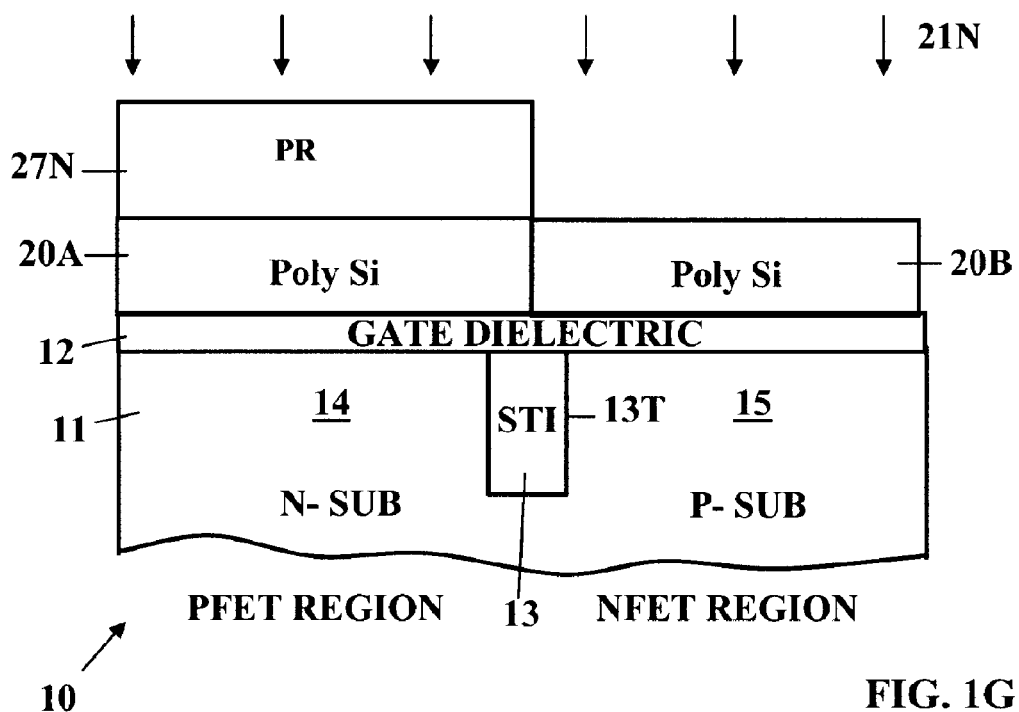
Figure 1H:
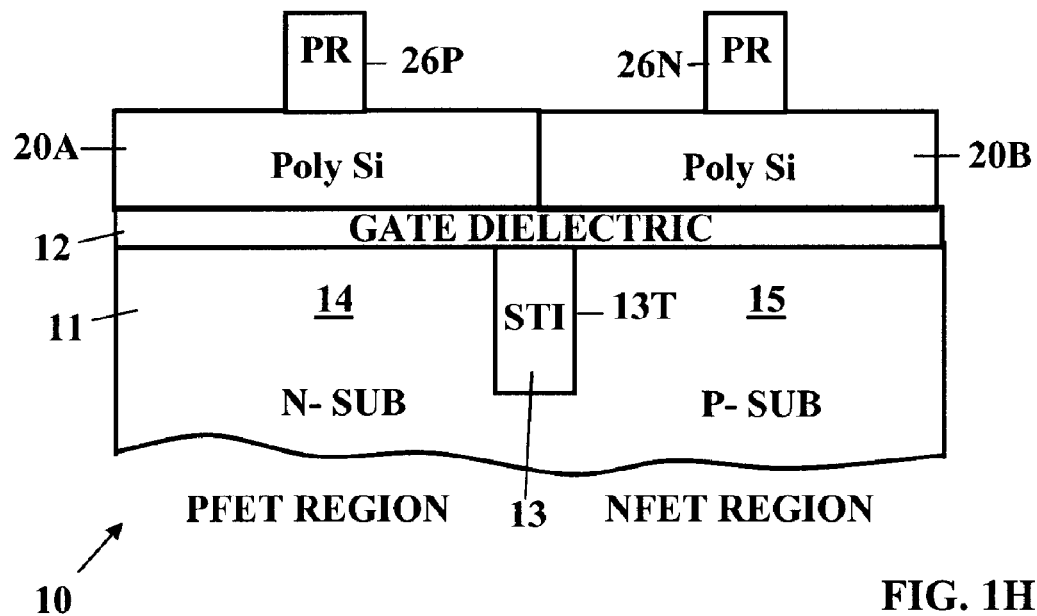
Figure 1I:
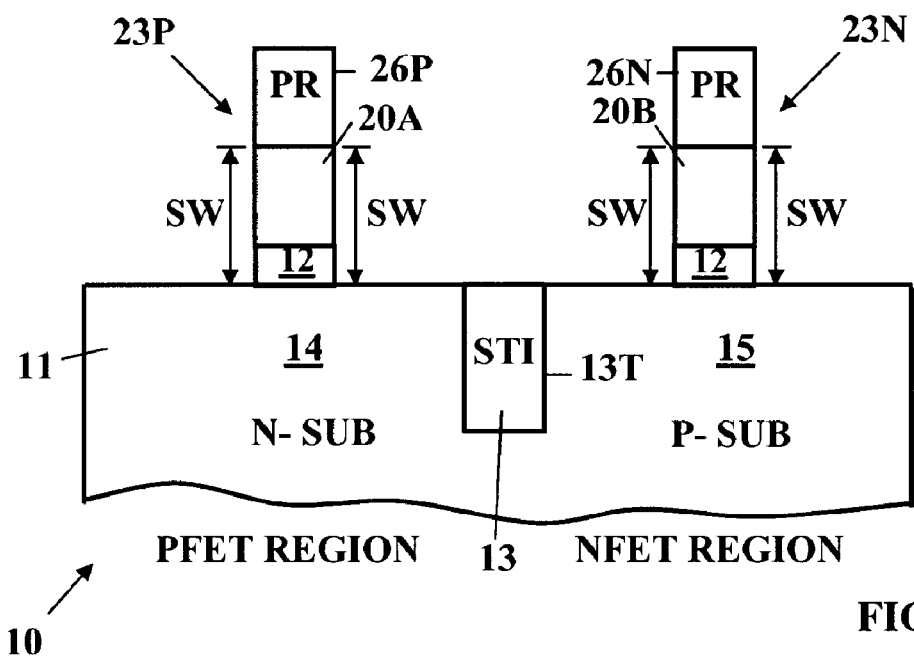
Figure 1J:
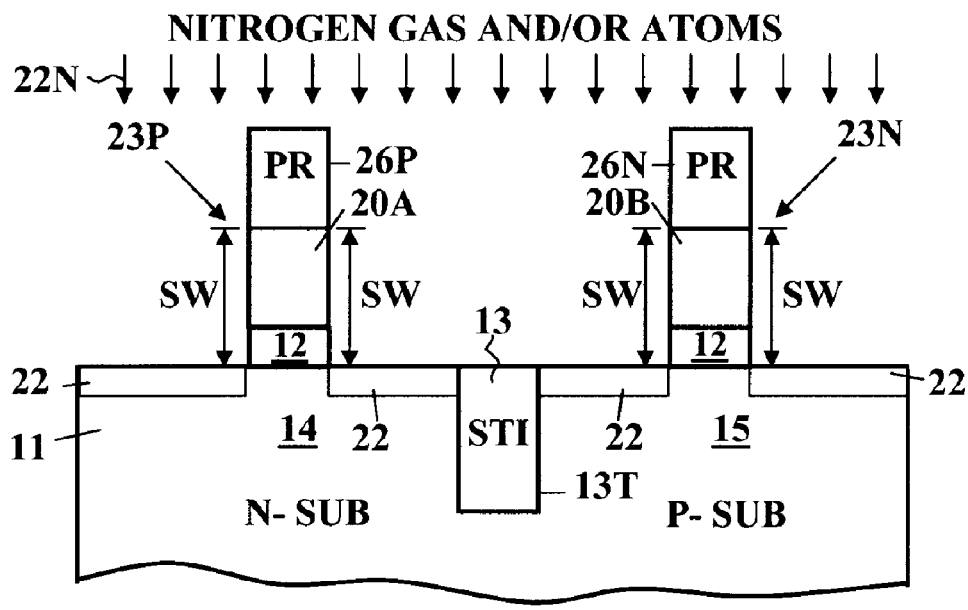
Figure 1K:
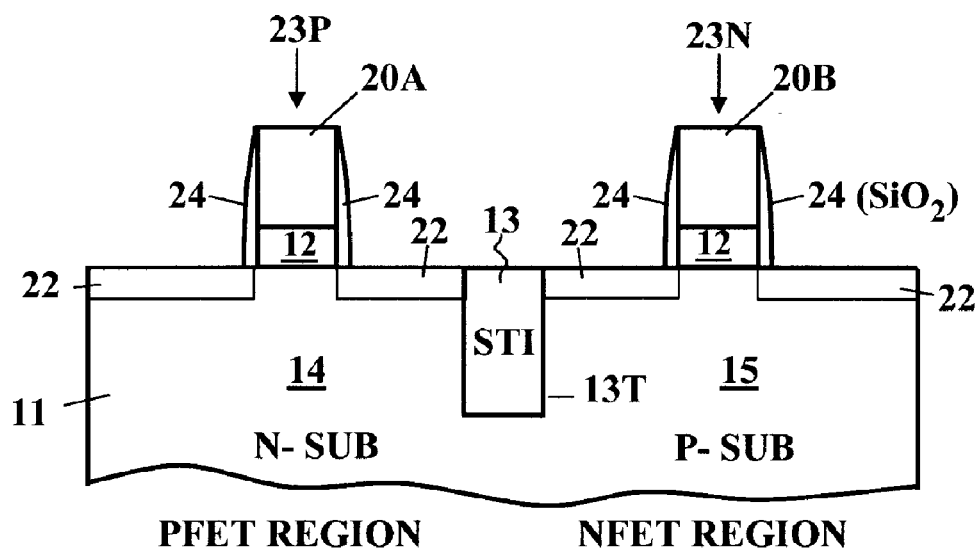
Figure 1L:
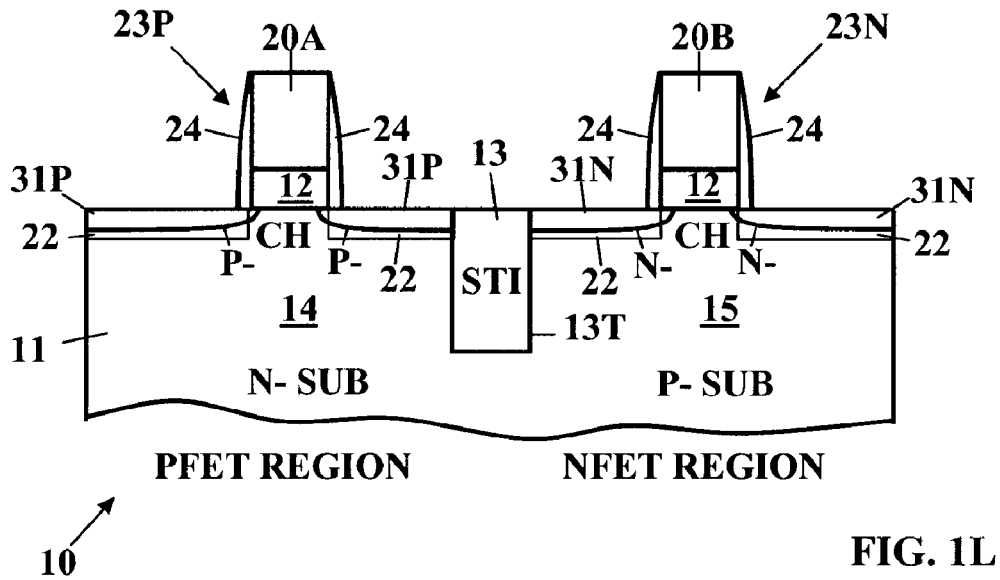
Figure 1M:
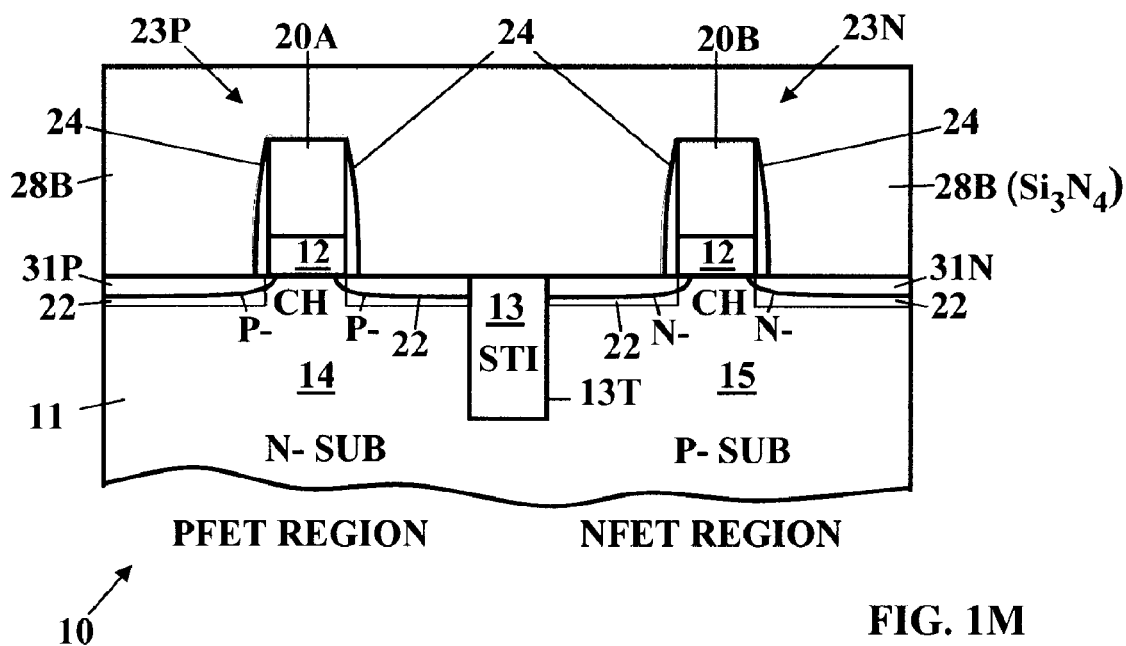
Figure 1N:
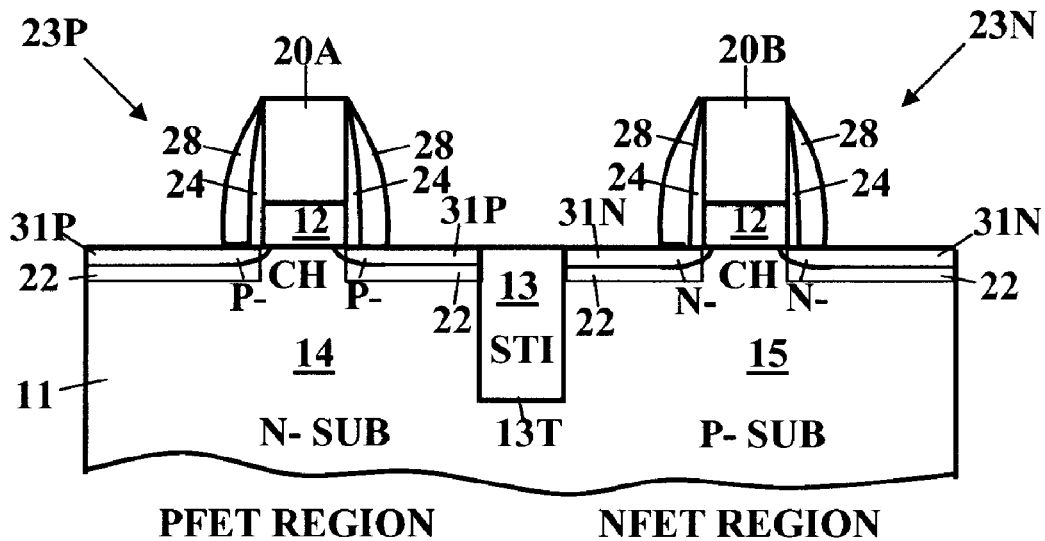
Figure 1O:
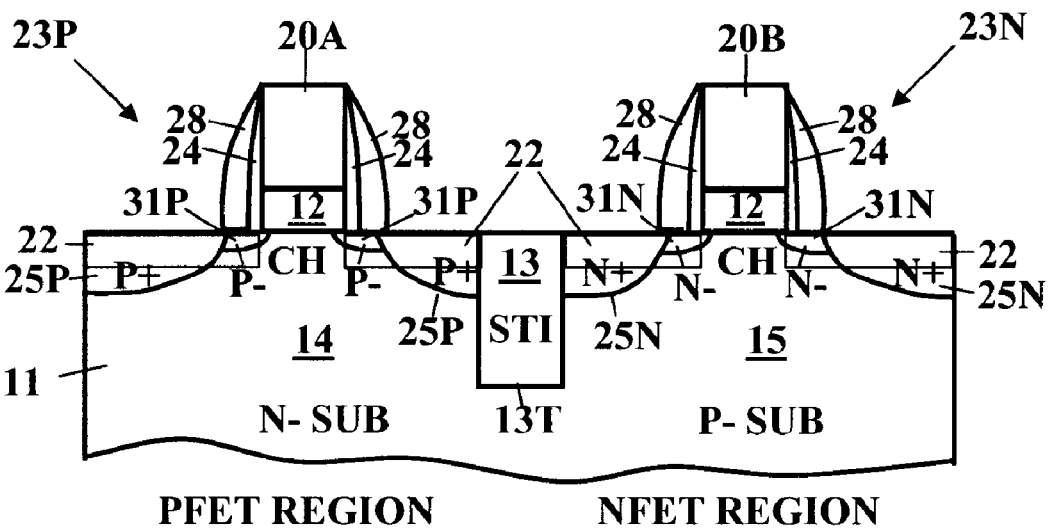

FIGS. 1A-1O show the process of forming a MOSFET device 10 in accordance with the method of this invention.

Figure 2:
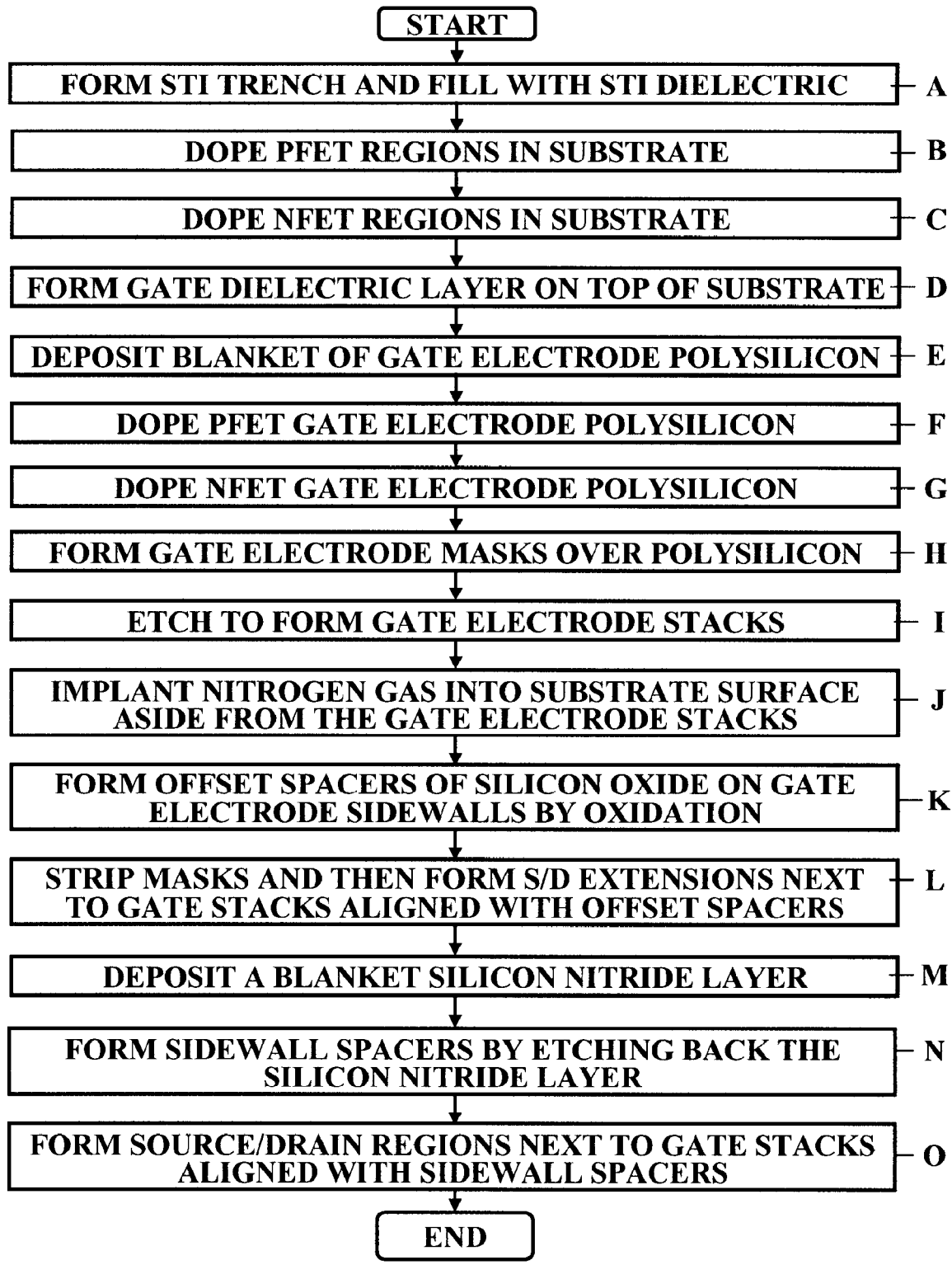
FIG. 2 is a flow chart of a method of manufacture of a MOSFET device in accordance with the method of this invention as illustrated by FIGS. 1A-1O.

FIG. 2 is a flow chart of the method of manufacture of the MOSFET device 10 in accordance with the method of this invention as illustrated by FIGS. 1A-1O.

A. Form STI Dielectric Region In An STI Trench Formed In Semiconductor Substrate FIG. 1A is a schematic sectional view of a device 10 in an early stage of manufacture comprising a semiconductor substrate 11 with a top surface in which a shallow trench 13T has been formed. The shallow trench 13T has been filled with dielectric material forming a Shallow Trench Isolation (STI) dielectric region 13. The STI dielectric region 13 in the substrate 11 is formed in accordance with step A in FIG. 2. The STI dielectric region 13 separates the upper portion of the PFET region on the left side of the semiconductor substrate 11 from the upper portion of the NFET region on right side of semiconductor substrate 11, as will be well understood by those skilled in the art.

The substrate 11 can comprise bulk Silicon (Si), Silicon on Insulator (SOI), bulk Germanium (Ge), Si/SiGe bilayers, or Si/SiGe on insulator. Also the device structure 10 could be modified to be in the form of 3D FETs such as FinFET devices, as will be well understood by those skilled in the art of FinFET devices.

B. Dope PFET Regions In The Semiconductor Substrate

As specified in step B in FIG. 2, the next step is to dope PFET regions in the substrate 11. FIG. 1B shows the device 10 of FIG. 1A during performance of the of step B in FIG. 2 in which a first temporary photolithographic (preferably photoresist PR) mask 14M has been formed over the NFET region on the right side of the STI dielectric region 13, covering at least a part of the surface thereof. With mask 14M in place the PFET region on the left side of the STI dielectric region 13 is shown being doped with N-type dopant ions 14I, thereby forming an N-SUB region 14 to the left side of the STI dielectric region 13. Preferably the N-SUB region 14 comprises an N-well formed in the substrate 11. Then the mask 14M is stripped exposing the top surface of the NFET region.

C. Dope NFET Regions In The Semiconductor Substrate

As specified in step C in FIG. 2, the next step is to dope NFET regions in the substrate 11. FIG. 1C shows device 10 of FIG. 1B during performance of step C in FIG. 2 in which a second temporary photolithographic (preferably photoresist PR) mask 15M has been formed over the PFET region on the left side of the STI dielectric region 13, covering at least a part of the surface thereof. With mask 15M in place the NFET region on the right side of device 10 is shown being doped with P-dopant ions 15I, thereby forming a P-SUB region 15 to the right side of the shallow trench 13T. Then the mask 15M is stripped exposing the top surface of the P-SUB region 15 in the PFET region.

In the process of doping shown by FIGS. 1B and 1C, a dopant level of from about 1e17 to about 1e18 atoms of dopant is preferred although not critical. Preferably highly localized halo doping is employed that goes up to about 1e19 atoms of dopant typically. As will be well understood by those skilled in the art a pad oxide layer which is conventionally employed is not shown for convenience of illustration and to make a more concise presentation of the invention.

D. Form Blanket Gate Dielectric Layer Over Substrate Including STI Dielectric

FIG. 1D shows the device 10 of FIG. 1C after step D in FIG. 2 in which a blanket, thin gate dielectric layer 12 has been formed covering the substrate 11 and the STI dielectric region 13. The gate dielectric layer 12, which is typically from about 0.8 nm to about 10 nm thick, is deposited preferably by a method such as thermal oxidation or chemical deposition. Preferably, the gate dielectric layer 12 is composed of a material selected from the group consisting of silicon oxide, silicon oxynitride, hafnium oxide, hafnium silicate, aluminum oxide, aluminum silicate, silicon nitride, zirconium oxide, zirconium silicate, tantalum oxide, tantalum silicate. Materials with similar characteristics can be employed.

E. Deposit A Blanket Gate Electric Layer

FIG. 1E shows the device 10 of FIG. 1D after step E in FIG. 2 in which a gate electrode layer 20 is deposited upon the gate dielectric layer 12. Preferably gate electrode layer 20 is composed of polysilicon but can be composed of or amorphous silicon or a metal or metal silicide such as tungsten, tungsten silicide, or nickel silicide. If the gate electrode layer 20 comprises polysilicon, it preferably has a thickness typically from about 50 nm to about 200 nm which is deposited by a process such as a Low Pressure Chemical Vapor Deposition (LPCVD) process or Atmospheric Pressure Chemical Vapor Deposition. If the gate electrode layer 20 comprises amorphous silicon (a-Si) film 16, it preferably has a thickness typically from about 50 nm to about 200 nm which is deposited by a process such as Low Pressure Chemical Vapor Deposition (LPCVD) process or an Atmospheric Pressure Chemical Vapor Deposition (APCVD) process. For deposition of an amorphous silicon (a-Si) thin film 20, the process can begin with a typical precursor such as silane ($SiH_4$) or dichlorosilane ($SiH_2Cl_2$). Preferably, the amorphous silicon (a-Si) thin film 16 is deposited by LPCVD at a temperature of between about 490° C. and 540° C., a pressure of between about 0.05 Torr and 50 Torr, and with a $SiH_4$ flow of between about 100 slm and 1500 slm.

F. Dope Gate Electrode Layer For PFET Region

FIG. 1F shows the device 10 of FIG. 1E after performing step F in FIG. 2, which is to form a P-doped PFET region 20A of the gate electrode layer 20 over the PFET regions on the left side of the substrate 11. FIG. 1F shows the device 10 of FIG. 1E during performance of the step F in FIG. 2 in which a third temporary photolithographic (preferably photoresist PR) mask 27P has been formed over the right side of the gate electrode layer 20 above the NFET region. The portion of the gate electrode layer 20 over the PFET region to the left side of the STI dielectric region 13 is shown being doped with P-type dopant ions 21P thereby forming the P-type doped, polysilicon, gate electrode region 20A to the left side of the STI dielectric region 13. Mask 27P is then stripped exposing the top surface of the undoped polysilicon, gate electrode region 20B on the right side of device 10.

G. Dope Gate Electrode Layer For NFET Region

FIG. 1G shows the device 10 of FIG. 1F after performing step G in FIG. 2, which is to form an N-doped NFET gate electrode region 20B of the gate electrode layer 20 over the NFET region on the right side of the substrate 11. FIG. 1G shows the device 10 of FIG. 1E during performance of the step F in FIG. 2 in which a fourth temporary photolithographic (preferably photoresist PR) mask 27N has been formed over the left side of the gate electrode layer 20 above the PFET region. The portion of the gate electrode layer 20 over the PFET region to the right side of the STI dielectric region 13 is shown being doped with P-type dopant ions 21N thereby forming the N-type doped polysilicon, gate electrode region 20B to the right side of the STI dielectric region 13. Mask 27N is then stripped exposing the top surface of the P-doped polysilicon, gate electrode region 20A on the left side of device 10.

H. Form Gate Electrode Masks Over PFET And NFET Gate Electrode Regions

FIG. 1H shows the device 10 of FIG. 1G after step G in FIG. 2, which is to form a gate electrode mask 26P located over the center of the N-sub region 14 in the PFET region as well as a similar gate electrode mask 26N located over the center of the P-sub region 15 in the NFET region.

I. Perform Anisotropic Etch Of Doped Polysilicon And Gate Dielectric To Form Gate Electrode Stacks FIG. 1I shows the device 10 of FIG. 1H after step I in FIG. 2 of anisotropically etching of the doped polysilicon layer 20 to form gate electrode regions 20A/20B (P-doped polysilicon, gate electrode region 20A and NFET gate electrode region 20B) and gate dielectric regions 12 formed from gate dielectric layer 12 aside from the masks 26P/26N to form gate electrode stack 23P over N-Sub region 14 as well as gate electrode stack 23N over P-Sub region 15. The gate electrode stacks 23P/23N have exposed sidewalls SW on the vertically extending sides of the doped polysilicon regions 20A/20B and on the vertically extending sides of gate dielectric regions 12.

J. Implant Nitrogen Gas Molecules And/Or Nitrogen Atoms Into The Semiconductor Substrate Surface Aside From The Gate Electrode Stacks FIG. 1J shows the device 10 of FIG. 1I during performance of the step J in FIG. 2 of implanting diatomic nitrogen gas ($N_2$) molecules and/or nitrogen atoms 22N into the top surface of the substrate 11 including the N-sub region 14 and the P-sub region 15 aside from the gate electrode stacks 23P/23N forming thin nitrogen implanted regions 22 in the top surfaces of both the N-sub region 14 and the P-sub region 15. As indicated above, the nitrogen gas and/or nitrogen atoms 22N are ion implanted for the purpose of suppressing the oxide formation on the exposed, horizontal, i.e. top surfaces of the semiconductor substrate 11 including the exposed top surfaces of both the N-sub region 14 and the P-sub region 15. The species of the nitrogen implanted in this step is typically diatomic nitrogen and/or nitrogen atoms. That is to say that the implanting of nitrogen is performed with nitrogen in the form of nitrogen atoms and/or diatomic nitrogen gas implanted into the substrate 11 aside from said gate electrode stacks 23P/23N. Typical conditions for the nitrogen implant are performed at a low energy of about between about 2 keV and about 10 keV. For diatomic nitrogen the dose is preferably about $2e14/cm^2$ with the range between about $5e13/cm^2$ and about $1e15/cm^2$. For atomic nitrogen the energy is between about 1 keV and about 5 keV with a dose between about $1e14/cm^2$ and $2e15/cm^2$.

K. Strip Masks, Then Form Offset Spacers Of Silicon Oxide On Gate Electrode Sidewalls By Oxidation FIG. 1K shows the device 10 of FIG. 1J after step K in FIG. 2 of stripping the masks 26P/26N from the top surface of the gate electrode stacks 23P/23N followed by forming offset spacers 24 composed of silicon oxide (e.g. silicon dioxide) above a portion of the semiconductor substrate 11 on the vertically extending sidewalls SW of the gate electrode stacks 23P/23N by oxidation in accordance with conventional methods of oxidation of gate electrode stacks to form offset spacers. FIG. 1K shows the bottom ends of the offset spacers 24 are in contact with the nitrogen implanted regions 22, with the offset spacers 24 reaching upwardly alongside the vertically extending sidewalls SW. The nitrogen implanted regions 22 act to suppress the formation of silicon oxide on the top (exterior horizontal) surfaces of both the N-sub region 14 and the P-sub region 15 of the semiconductor substrate 11. The silicon oxide then grows preferentially on the sidewalls SW of the gate electrode stacks 23P/23N where it is needed to offset the extension implants 31P/31N (shown in FIG. 1L). As compared to the sidewalls SW, less silicon oxide grows on the top (exterior horizontal) silicon surfaces of both the N-sub region 14 and the P-sub region 15 that will receive the extension implants 31P/31N in step L. The oxidation is done in a furnace at around 800° C. (between 700° C. and 1000° C.) for about 10 minutes (between 5 and 30 minutes). With the nitrogen implant, since the silicon oxide on the horizontal silicon surface is much thinner than that on the sidewalls of the gate electrode stack, at this point in the process, a minimal DHF etch can remove this horizontal portion of the silicon oxide completely without completely removing the silicon oxide from the gate sidewall. Say a DHF oxide etch that targets about 20Å, this would leave about 20Å on the sidewalls of the gate electrode stack based on the dimensions shown in FIGS. 4A/4B. It is believed that further optimization of the method of nitrogen implantation in accordance with this invention can achieve an even greater oxidation differential between the thickness of the silicon oxide on the offset spacers on gate electrode sidewalls and silicon oxide on the top surface of the semiconductor substrate 11.

L. Form S/D Extensions Next To Gate Stacks Aligned With Offset Spacers

FIG. 1L shows the device 10 of FIG. 1K after step L in FIG. 2 of forming S/D extensions 31P/31N next to gate stacks aligned with the offset spacers 24. The formation of the extensions 31P/31N involves the conventional steps of sequentially masking the PFET and NFET regions of the device 10 and implanting P type dopant into the surface of the N-sub 14 in the PFET region to form the P-doped extension regions 31P and implanting N type dopant into the surface of the P-sub 15 in the NFET region to form the N-doped extension regions 31N. In summary, conventional masks are formed followed by ion implantation steps which are performed successively in the PFET and NFET regions as will be well understood by those skilled in the art.

M. Deposit A Blanket Sidewall Spacer (Silicon Nitride) Layer Covering Top Surface Of Device FIG. 1M shows the device 10 of FIG. 1L after step M in FIG. 2 of depositing a blanket silicon nitride layer 28B covering top surface of device 10 including the gate electrode stacks 23P/23N and the offset spacers 24. Preferably the blanket silicon nitride layer 28B is formed by CVD silicon nitride deposition using methods well known to those skilled in the art.

N. Form Sidewall Spacers By Etching Back The Sidewall Spacer (Silicon Nitride) Layer FIG. 1N shows the device 10 of FIG. 1M after step N in FIG. 2 of forming sidewall spacers 28 composed of a dielectric such as silicon nitride by anisotropically etching back the silicon nitride layer 28B using methods well known to those skilled in the art.

O. Form Source/Drains Region Next To Gate Stacks Align With Sidewall Spacers

FIG. 1O shows the device 10 of FIG. 1K after step N in FIG. 2 of forming source/drain (S/D) regions 25P/25N next to gate stacks 23P/23N respectively aligned with sidewall spacers 28. The formation of the S/D regions 25P/25N involves a conventional sequence of steps of masking the PFET and NFET regions of device 10 and implanting P type dopant into the surface of the N-sub 14 in the PFET region to form the P-doped S/D regions 25P and implanting N type dopant into the surface of the P-sub 15 in the NFET region to form the N-doped S/D regions 25N, as will be well understood by those skilled in the art. In summary, conventional masks are formed followed by successive ion implantation steps performed in the PFET and NFET regions, as will be well understood by those skilled in the art.

Figure 3A:
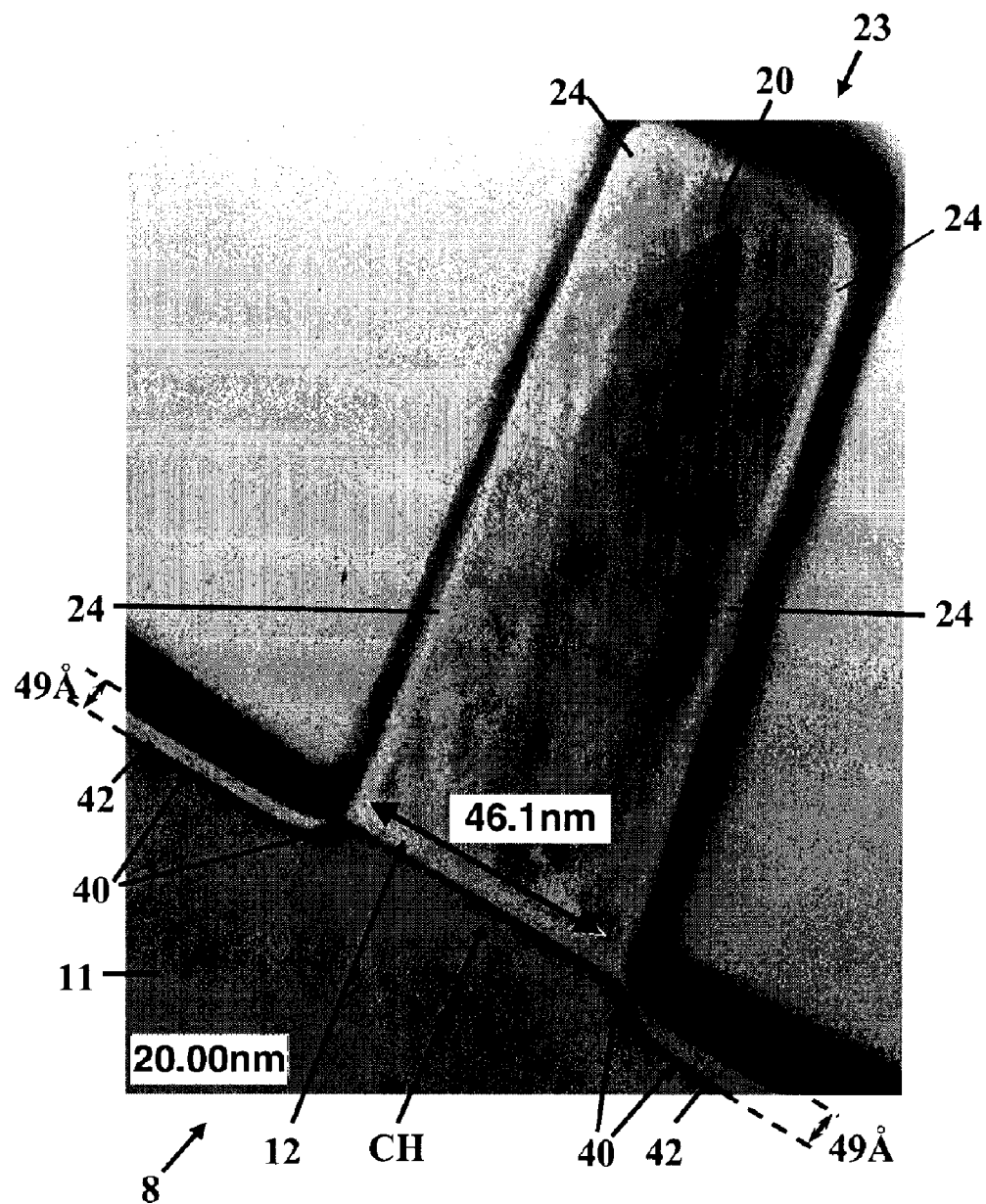
FIGS. 3A and 3B are TEM images of a MOSFET structure in an early stage in a prior art process of manufacture thereof.
Figure 3B:
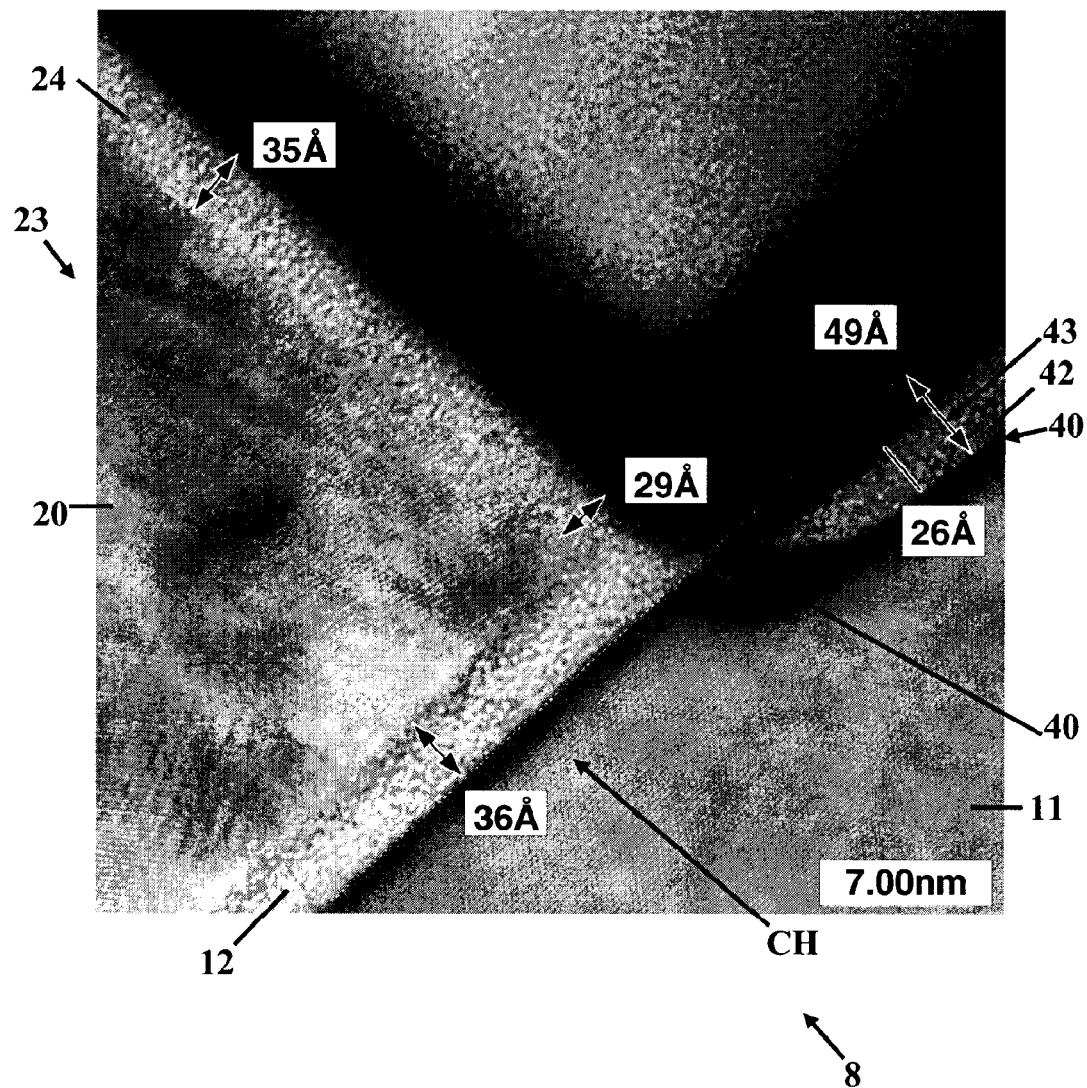
Figure 4A:
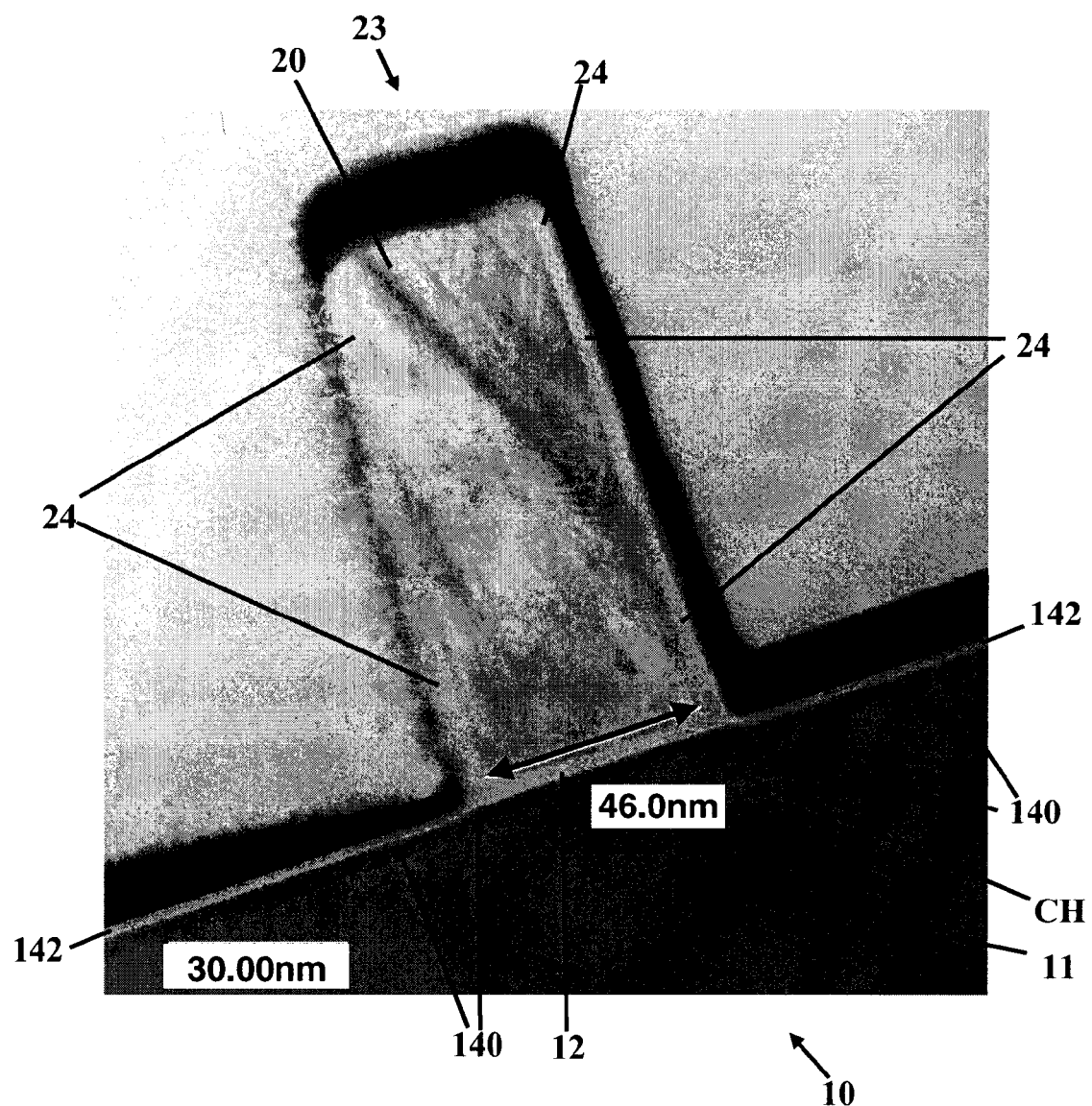
FIGS. 4A and 4B are TEM images of a MOSFET structure 10 which are a modification of the FET structure of FIGS. 3A/3B in an early stage in the process of manufacture thereof in accordance with the method of this invention.
Figure 4B:
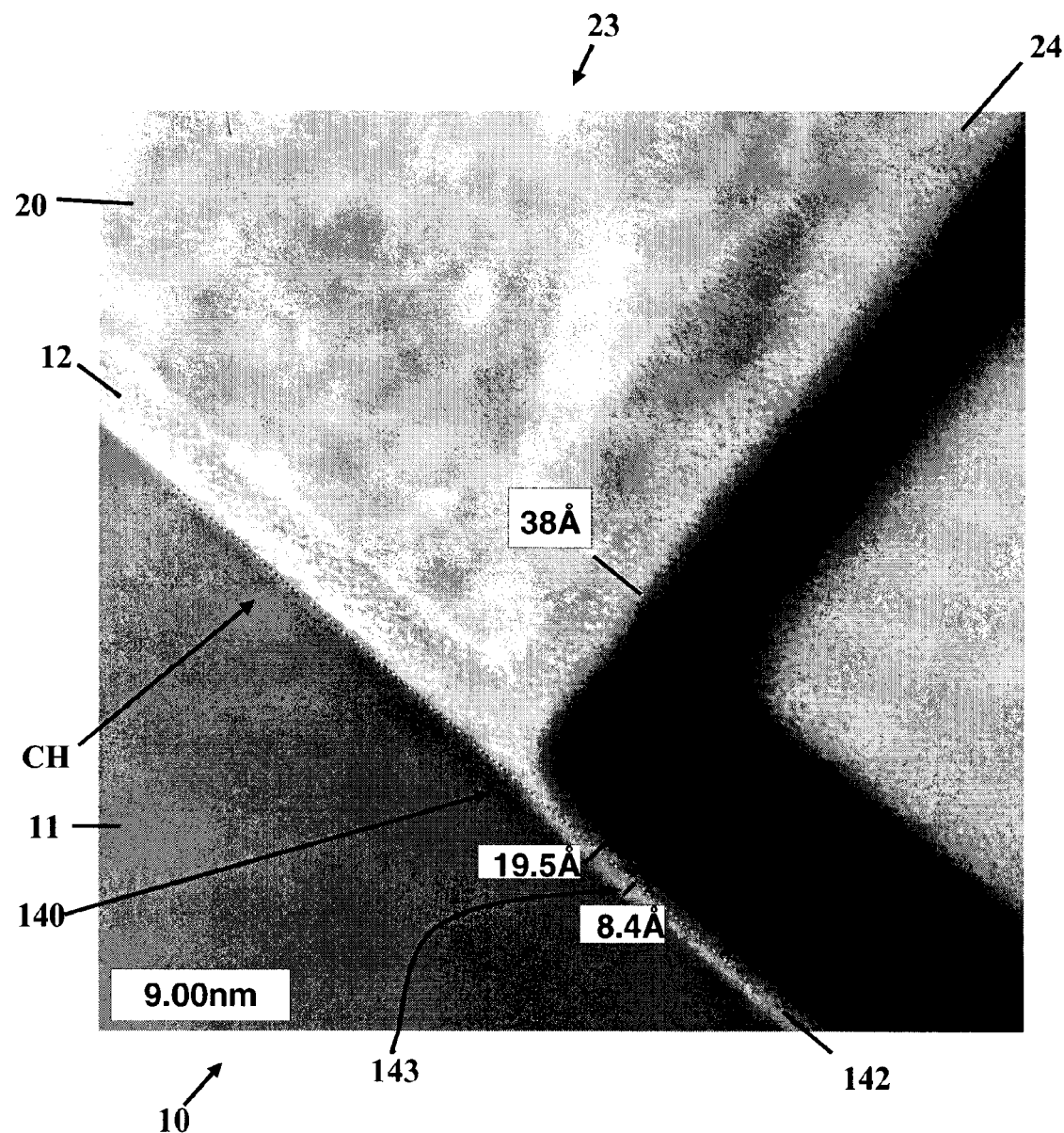

FIGS. 4A and 4B are TEM images of a MOSFET structure 10 which are a modification of the FET structure 8 of FIGS. 3A/3B in an early stage in the process of manufacture thereof in accordance with the method of this invention. Those TEM images show the result of the method of this invention in which offset spacers 24 are produced while, at the same time, minimal silicon recess 140 are formed in semiconductor substrate 11 and minimal oxidation occurs on the surface of semiconductor substrate 11.

FIG. 4A shows a MOSFET structure 10 a low magnification TEM image (with a 30.00 nm scale) of an early stage in the process of manufacture of showing a semiconductor substrate 11 on which a gate electrode stack 23 is formed. The gate electrode stack 23 comprises a polysilicon gate electrode 20 formed over a gate dielectric layer 12 composed of silicon oxide formed over the surface of the semiconductor substrate 11 above what is to be the channel region CH of a MOSFET device in the substrate 11. The gate electrode polysilicon 20 has a length of 46.0 nm. The sides of the gate electrode 20 are covered with a pair of offset spacers 24 (35 Å thick) which are shown and which were formed by deposition of a layer of silicon dioxide onto the surface of the device 10. Then the silicon dioxide was shaped by RIE processing into the offset spacers 24 shown on the sidewalls of the gate electrode 20. There is a of RIE residual film 142 on the surface of the semiconductor substrate 11. A pair of very shallow recesses 140 is shown in the top surface of the semiconductor substrate 11 on either side of the channel CH. The RIE processing which was used to shape the offset spacer 24 by etching was deterred by the nitrogen implantation resulting in the very shallow recesses 140. This illustrates a very substantial mitigation of the problem with unwanted recesses 140 formed in the surface of the semiconductor substrate 11 on either side of the gate electrode stack 23 and the channel CH. The shallow recesses 140 have a depth of about 8.4 Å, less than one fifth of that of the 49 Å depth of the deeper recesses 40 shown in FIGS. 3A/3B. In this case the surface of the semiconductor substrate 11 was etched minimally and a thinner residual film 142 was formed on an active semiconductor surface following implanting the surface of the semiconductor substrate 11 with nitrogen ($N_2$) molecules. That is to say that the nitrogen gas molecules and/or nitrogen atoms 22N are implanted before an oxidation step is employed to form the offset spacers 24. The gate electrode polysilicon has a length of 46.0 nm.

FIG. 4B shows a high magnification TEM image of the MOSFET structure 10 of FIG. 4A with a 9.00 nm scale showing the offset spacer 24 and a thinner layer of residual film 142 on the surface of the semiconductor substrate 11. The thickness of the offset spacers 24 is 38 Å. The thickness of the residual film 142 on the active silicon is 19.5 Å. The depth 143 of the of the recess 140 in the semiconductor substrate 11 is only 8.4 Å

While this invention has been described in terms of the above specific embodiment(s), those skilled in the art will recognize that the invention can be practiced with modifications within the spirit and scope of the appended claims, i.e. that it is contemplated that changes can be made in form and detail, without departing from the spirit and scope of the invention. Accordingly all such changes come within the purview of the present invention and the invention encompasses the subject matter of the following claims.

What is claimed is:

1. A method of forming an integrated circuit device by the following steps:
    forming a doped region in a silicon semiconductor substrate which has a top substrate surface;
    forming a gate electrode stack over a portion of said semiconductor substrate with said gate electrode stack with vertically extending sidewalls including a gate dielectric layer and a gate electrode overlying said gate dielectric layer;
    vertically implanting of nitrogen molecules or nitrogen atoms into said doped region of said semi-conductor substrate aside from said gate electrode stack at a low energy level of about between about 2 keV and a maximum energy of about 10 keV forming a nitrogen implanted layer in said doped region of said semiconductor substrate without amorphizing said silicon semiconductor substrate;
    forming silicon oxide offset spacers preferentially on said vertically extending sidewalls of said gate electrode stack and in contact with a portion of said nitrogen implanted layer of said semiconductor substrate by a step of oxidation of said gate electrode stacks to form with said nitrogen implanted layer in said doped region acting to suppress formation of silicon oxide on said top substrate surface of said doped region in said semiconductor substrate; and
    then etching to remove silicon oxide completely from said top substrate surface without completely removing silicon oxide from said vertically extending sidewalls of said gate electrode stack;
    whereby said doped region implanted with nitrogen molecules or nitrogen atoms acts to suppress the formation of silicon oxide on the top surface of said doped region of said semiconductor substrate without distortion of bonds in said silicon semiconductor substrate and said silicon oxide offset spacers remain on said vertically extending sidewalls.

2. The method of claim 1 including the steps comprising:
    implanting a first level of dopant to form source/drain extension regions in said semiconductor substrate aside from said offset spacers;
    forming sidewall spacers on outer surfaces of said offset spacers over another portion of said nitrogen implanted layer; and
    implanting a higher level of dopant to form source/drain regions in said semiconductor substrate aside from said sidewall spacers.

3. The method of claim 1 wherein said sidewall spacers are composed of silicon nitride.

4. The method of claim 1 wherein said offset spacer layer over said device is formed by said step of oxidation in a furnace at a temperature between about 7000° C. and about 1000° C. and for less than or equal to about 30 minutes.

5. The method of claim 4 wherein said step of oxidation is done in a furnace at about 800° C. for a duration of between about 5 minutes and about 30 minutes.

6. The method of claim 1 wherein: said implanting of nitrogen is performed with nitrogen in the form of nitrogen atoms and/or diatomic nitrogen gas implanted into said substrate aside from said gate electrode stack at as follows:
    a maximum energy less than or equal to 10 keV for diatomic nitrogen, or
    at a maximum energy less than or equal to 5 keV for nitrogen atoms; and
    said offset spacer layer is formed at a temperature less than or equal to 100° C. for a time of less than or equal to 30 minutes.

7. The method of claim 1 wherein:
    said implanting of nitrogen in the form of nitrogen atoms and/or diatomic nitrogen gas into said substrate aside from said gate electrode stack is performed with the conditions as follows:
    for diatomic nitrogen at an energy between about 2 keV and about 10 keV and at dose of between about 5e13/$cm^2$ and about 1e15/$cm^2$, or for atomic nitrogen at an energy between about 1 keV and about 5 keV and a dose of between about 1e14/cm² and about 2e15/cm².

8. The method of claim 1 wherein:
said offset spacer layer is formed at a temperature between about 700° C. and about 100° C., and for a duration between about 5 minutes and about 30 minutes.

9. The method of claim 8 wherein:
said implanting of nitrogen in the form of nitrogen atoms and/or diatomic nitrogen gas into said substrate aside from said gate electrode stack is performed with the conditions as follows:
for diatomic nitrogen at an energy between about 2 keV and about 10 keV and at dose of between about 5e13/cm² and about 1e15/cm²; and
for atomic nitrogen at an energy between about 1 keV and about 5 keV and a dose of between about 1e14/cm² and about 2e15/cm².

10. A method of forming an integrated circuit device comprising:
forming doped regions in a semiconductor substrate;
forming a gate electrode stack comprising a gate dielectric layer with a gate electrode overlying said gate dielectric layer over a portion of said semiconductor substrate and said gate electrode stack including vertically extending sidewalls;
then performing a step of vertically implanting nitrogen in the form of nitrogen atoms and/or diatomic nitrogen gas into said doped regions of said semiconductor substrate to form nitrogen implanted regions in said doped regions of semiconductor substrate aside from said gate electrode stack without amorphizing said silicon semiconductor substrate by at least one step selected from as follows:
at a low energy of about between about 2 keV and a maximum energy less than or equal to 10 keV for diatomic nitrogen without amorphizing said semiconductor substrate; or
at a low energy of about between about 2 keV and a maximum energy less than or equal to 5 keV for atomic nitrogen without amorphizing said semiconductor substrate; and
performing said step of vertically implanting of nitrogen at a temperature less than or equal to 1000° C. for a time of less than or equal to 30 minutes; and
forming silicon oxide offset spacers on said vertically extending sidewalls of said gate electrode stack and in contact with said semiconductor substrate vertically extending sidewalls of said gate electrode stack by a step of oxidation of said gate electrode stacks to form said offset spacers with said nitrogen implanted regions acting to suppress formation of silicon oxide on top surfaces of said doped regions in said semiconductor substrate;
then performing a DHF etch to remove silicon oxide from said top surface of said doped region in said nitrogen implanted region completely without completely removing the silicon oxide from said vertically extending sidewalls of said gate electrode stack;
implanting a first level of dopant to form source/drain extension regions in said substrate aside from said silicon oxide offset spacers;
forming silicon nitride sidewall spacers on outer surfaces of said silicon oxide offset spacers over another portion of said nitrogen implanted layer; and
implanting a higher level of dopant to form source/drain regions in said substrate aside from said silicon nitride sidewall spacers;
whereby said doped region implanted with nitrogen molecules or nitrogen atoms acts to suppress the formation of silicon oxide on the top surface of said doped region of said semiconductor substrate without distortion of bonds in said silicon semiconductor substrate due to implantation of said nitrogen therein and whereby said silicon oxide offset spacers remain on said vertically extending sidewalls.

11. The method of claim 10 wherein said implanting of nitrogen in the form of nitrogen atoms and/or diatomic nitrogen gas into said substrate aside from said gate electrode stack is performed with the conditions as follows:
for diatomic nitrogen at an energy between about 2 keV and about 10 keV and at dose of between about 5e13/cm² and about 1e15/cm²; and
for atomic nitrogen at an energy between about 1 keV and about 5 keV and a dose of between about 1e14/cm² and about 2e15/cm².

12. The method of claim 10 wherein said step of oxidation is performed in a furnace between about 700° C. and about 1000° C. for a duration between about 5 minutes and about 30 minutes.

13. The method of claim 11 wherein said step of oxidation is performed in a furnace between about 700° C. and about 1000° C. for a duration between about 5 minutes and about 30 minutes.

14. The method of claim 11 wherein said offset spacers are formed of silicon oxide.

15. The method of claim 11 wherein said sidewall spacers are formed of silicon nitride.

16. The method of claim 14 wherein said sidewall spacers are formed of silicon nitride.

* * * * *